(12) United States Patent
Masunaga et al.

(10) Patent No.: US 8,367,295 B2
(45) Date of Patent: Feb. 5, 2013

(54) PREPARATION PROCESS OF CHEMICALLY AMPLIFIED RESIST COMPOSITION

(75) Inventors: Keiichi Masunaga, Joetsu (JP); Takanobu Takeda, Joetsu (JP); Tamotsu Watanabe, Joetsu (JP); Satoshi Watanabe, Joetsu (JP); Ryuji Koitabashi, Joetsu (JP); Osamu Watanabe, Joetsu (JP)

(73) Assignee: Shin-Etsu Chemical Co., Ltd. (JP)

( * ) Notice: Subject to any disclaimer, the term of this patent is extended or adjusted under 35 U.S.C. 154(b) by 517 days.

(21) Appl. No.: 12/110,651

(22) Filed: Apr. 28, 2008

(65) Prior Publication Data

US 2008/0274422 A1    Nov. 6, 2008

(30) Foreign Application Priority Data

May 2, 2007    (JP) .................................. 2007-121545

(51) Int. Cl.
*G03F 7/004* (2006.01)
(52) U.S. Cl. ...................... 430/270.1; 430/905; 430/910
(58) Field of Classification Search .............. 430/270.1, 430/905, 910
See application file for complete search history.

(56) References Cited

U.S. PATENT DOCUMENTS

| 2006/0073413 A1 | 4/2006 | Takemura et al. |
| 2006/0094817 A1 | 5/2006 | Harada et al. |
| 2006/0166133 A1 | 7/2006 | Koitabashi et al. |
| 2006/0183051 A1 | 8/2006 | Takeda et al. |

FOREIGN PATENT DOCUMENTS

| JP | 2006-106311 A | 4/2006 |
| JP | 2006-124341 A | 5/2006 |
| JP | 2006-201532 A | 8/2006 |
| JP | 2006-225476 A | 8/2006 |

*Primary Examiner* — John Chu
(74) *Attorney, Agent, or Firm* — Myers Bigel Sibley & Sajovec, PA (57) ABSTRACT

Provided are a preparation method of a resist composition which enables stabilization of a dissolution performance of a resist film obtained from the resist composition thus prepared; and a resist composition obtained by the preparation process and showing small lot-to-lot variations in degradation over time. The process of the present invention is for preparing a chemically amplified resist composition containing a binder, an acid generator, a nitrogenous basic substance and a solvent and it has steps of selecting, as the solvent, a solvent having a peroxide content not greater than an acceptable level, and mixing constituent materials of the resist composition in the selected solvent.

7 Claims, 1 Drawing Sheet

PREPARATION PROCESS OF CHEMICALLY AMPLIFIED RESIST COMPOSITION

CROSS-RELATED APPLICATIONS

This application claims priority from Japanese Patent Application No. 2007-121545; filed May 2, 2007, the disclosure of which is incorporated herein by reference in its entirety.

BACKGROUND OF THE INVENTION

1. Field of the Invention

The present invention relates to a preparation process of a chemically amplified positive resist material used for micropatterning and sensitive to high energy radiation such as ultraviolet ray, far ultraviolet ray, electron beam, X ray, excimer laser, γ ray and synchrotron radiation.

2. Description of the Related Art

In the drive for higher integration of integrated circuits, formation of finer patterns is requested recently. As resists used for photolithography with KrF excimer laser light having a wavelength of 248 nm or exposure light having a shorter wavelength than it, or lithography with high energy radiation such as electron beam or X-ray, a chemically amplified resist is predominant because of its excellent sensitivity and resolution.

Chemically amplified resists include negative resists and positive resists. The negative resists (described, for example, in Japanese Patent Provisional Publication No. 2006-201532) essentially contain a binder soluble in an aqueous alkali solution, a crosslinking agent (in some cases, an agent serving both as a crosslinking agent and a binder) for crosslinking binders and insolubilizing them in the presence of an acid, and an acid generator which generates an acid when exposed to high energy radiation. The positive resists (described, for example, in Japanese Patent Provisional Publication No. 2006-225476 and Japanese Patent Provisional Publication No. 2006-124314), on the other hand, essentially contain a binder which is insoluble in an aqueous alkali solution but becomes alkali soluble after elimination of a protecting group in the presence of an acid and an acid generator.

When exposed to high energy radiation, a resist film containing the above-described materials undergoes a change in its solubility due to a catalytic reaction caused by an acid generated from the acid generator. It is extremely important for microfabrication to control a range within which the acid causes a catalytic reaction, that is, to control a diffusion distance of the acid, because small diffusion distance of the acid fails to achieve expected sensitivity, while large diffusion distance reduces a light/dark contrast and deteriorates the resolution performance. A basic compound serving to control this diffusion distance of the acid is therefore a substantially essential constituent material for either the positive resist or negative resist. Such a basic compound to be added to the resist composition is typically a nitrogenous basic substance. Many nitrogenous basic substances are known and disclosed, for example, in Japanese Patent Provisional Publication Nos. 2006-201532, 2006-225476 and 2006-124314.

In processing of a substrate with a chemically amplified resist, a resist film is formed by applying a solution of the above-described materials so that the resist composition further contains a solvent as an essential material.

SUMMARY OF THE INVENTION

It is the common practice to examine the basic resolution performance of the product of a resist composition after its preparation in order to inspect its quality. When a resist composition judged acceptable is used for pattern formation after degradation is accelerated by storage at a temperature higher than room temperature, patterns are sometimes much inferior in the shape compared with reference patterns. Particularly, the influence of degradation is relatively large when patterns are small. Degradation in rectangularity may lead to a problem in the dimensional accuracy upon etching.

The products which showed such large degradation in the acceleration test were conventionally treated as accidental products and the lot which had included the materials of them was discarded or the like. It is however possible to improve a production yield and prevent the accident if the cause of the problem can be elucidated in advance.

An object of the present invention is to overcome the above-described problem and thereby provide a preparation process of a resist composition which enables stabilization of the resolution performance of a resist film obtained from the resist composition thus prepared and a resist composition prepared by the process which shows small lot-to-lot variations in degradation over time.

The present inventors have carried out an intensive research on the cause for occurrence of a difference in the resist pattern shape after resolution. As a result, it has been found by $^1$H-NMR analysis that in a resist composition which shows large degradation over time in the pattern shape at an acceleration test, a portion of a nitrogenous basic substance added to the composition has been oxidized into a nitrogen oxide. This means that an increased nitrogen oxide content in the composition results in the abnormality of a pattern shape.

All the materials are analyzed for their purity before preparation of a resist composition. As a cause for the progress of only the oxidation of a nitrogenous basic substance contained in a specific lot though the materials have no problem upon preparation of the composition, mixing of a trace amount of an oxide in the materials added to the resist composition is strongly suspected. A solvent used in a particularly large amount may be a sufficient source for oxides even if the concentration of the oxides in the solvent is not evidently high. In addition, the solvent having, in the molecule thereof, a carbon-carbon double bond, ether bond, carbonyloxy group or hydroxyl group may potentially form a peroxide with oxygen in the air. It has also been found that the solvent actually contains a peroxide as a result of measuring a peroxide content in the resist solvent and that use of only solvents having a small peroxide content makes it possible to prevent a chemical change of a nitrogenous basic substance into a nitrogen oxide, thereby preventing occurrence of degradation in pattern shapes within a standard storage period, leading to the completion of the present invention.

In the present invention, there is thus provided a process for preparing a chemically amplified resist composition having a binder, an acid generator, a nitrogenous basic substance and a solvent, which has the steps of selecting, as the solvent, a solvent having a peroxide content not greater than an acceptable level, and mixing constituent materials of the resist composition in the solvent thus selected.

In the preparation process of present invention, the step of selecting the solvent may include a step of measuring the peroxide content, or a step of diluting a solvent having a peroxide content greater than the acceptable level with a solvent having a peroxide content not greater than the acceptable level.

The preparation process of the present invention is also suited for use in the case where the solvent has, in the molecule thereof, a carbon-carbon double bond, ether bond, carbonyloxy group, and/or hydroxyl group.

The preparation process of a chemically amplified resist composition according to the present invention enables improvement in a production yield and can prevent an accident, that is, degradation in pattern shape even within a standard storage period.

DETAILED DESCRIPTION OF THE PREFERRED EMBODIMENT(S)

Figure 1:
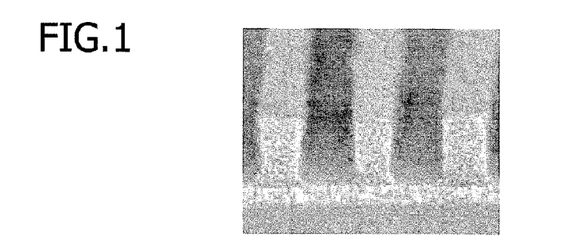
FIG. 1 is an SEM image of a 150-nm line and space pattern formed using Sample (I)
Figure 2:
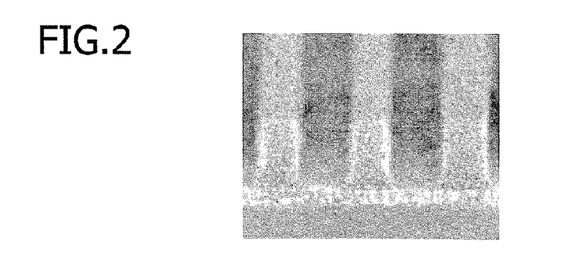
FIG. 2 is an SEM image of a 150-nm line and space pattern formed using Sample (III)
Figure 3:
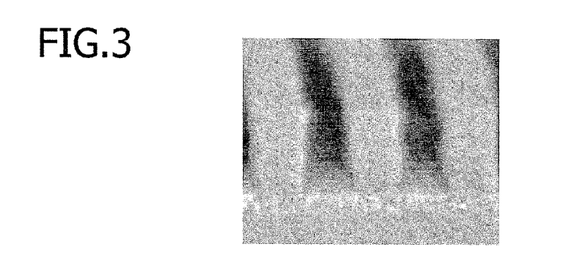
FIG. 3 is an SEM image of a 150-nm line and space pattern formed using Sample (IV)
Figure 4:
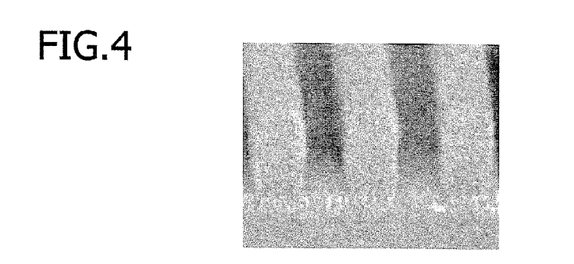
FIG. 4 is an SEM image of a 150-nm line and space pattern formed using Sample (VI).

The present invention now will be described more fully hereinafter in which embodiments of the invention are provided with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

Hereinafter, preferred embodiments of the present invention will be described. However, it is to be understood that the present invention is not limited thereto.

As a chemically amplified resist, a number of positive resists and negative resists are already known publicly. It typically contains, as essential constituent materials, a binder for forming a film and an acid generator which is decomposed to generate a strong acid when exposed to high energy radiation. A negative resist further contains a crosslinking agent. In order to attain high resolution stably by using a chemically amplified resist as described above, a basic substance is substantially an essential constituent material. A nitrogenous basic substance is usually employed as the basic compound. Prior to preparation of the resist composition, these materials are under proper control to achieve high resolution. Taking the binder as an example, the molecular weight and dispersity are controlled and if it has a relatively small molecular weight, its purity is severely controlled.

The binder for forming a film must have, if it serves as a binder for a chemically amplified resist, a function of changing its solubility from insoluble to soluble in an aqueous alkaline solution when the chemical amplified resist is a positive type and from soluble to insoluble when it is a negative type by the catalytic action of an acid generated from the acid generator.

It is well known that in a positive resist, the function of changing the solubility is usually available from a material having a functional group masked with a protecting group which will be eliminated by an acid later, the functional group including such as phenolic hydroxyl group, carboxyl group, or in some cases, an alcoholic hydroxyl group of which a proximal hydrogen is substituted with a plurality of fluorine atoms. Many protecting groups to be eliminated by an acid are also known and they can be typically classified into tertiary carbons and acetals (refer to, for example, JP2006-225476 and JP2006-124314).

In a negative resist, on the other hand, such a function is available from a material having both a functional group capable of giving alkali solubility and a functional group capable of forming a bond between binders or crosslinking agents. The functional group capable of giving alkali solubility sometimes has a binding activity with the crosslinking agent. Many of them are also well known. A functional group forming a bond between binders or a crosslinking functional group of the crosslinking agent causes dealcoholization or dehydration by the acid and forms an oxygen-carbon bond or carbon-carbon bond with a hydroxyl group or aromatic ring and many of them are also publicly known (refer to, for example, JP2006-201532).

Another function required for the binder is resistance against dry etching, for example, fluorine type dry etching or chlorine type dry etching to be used for etching of a substrate following the patterning of the substrate. Many studies on the resistance against dry etching figure out that materials having an aromatic skeleton or alicyclic skeleton and showing relatively small absorption of high energy radiation are suited and a number of actual examples of the binder are known (for example, JP2006-201532, JP2006-225476 and JP2006-124314). In a resist used for a multilayer resist process, a silicon-containing material is also well-known because of its resistance against oxygen type dry etching and many actual examples of it are known (for example, JP2006-106311).

The acid generator is a substance which is decomposed and generates a strong acid when exposed to high energy radiation such as ultraviolet light, far ultraviolet light, electron beam, X ray, excimer laser, γ ray or synchrotron radiation. Many compound groups, for example, sulfoniums and iodoniums are known to cause such decomposition and many acids including fluoroalkylsulfonic acids are known as the acid generated by the decomposition (for example, JP2006-201532, JP2006-225476, JP2006-124314 and JP2006-106311).

The chemically amplified resist has a function of causing switching of solubility in a developing solution and the function is achieved by the combination of the above-described raw materials. As is well known, the acid generated by exposure to energy radiation catalytically reacts with the functional group of the binder or crosslinking agent while diffusing thermally, making it possible to impart the resist with high-sensitivity performance which is a characteristic of the chemically amplified resist. It is well known that a too large diffusion distance deteriorates the contrast between a region where the acid is generated and a region where the acid is not generated and reduces the resolution so that in order to keep the diffusion distance within a certain range, the diffusion distance of the acid is controlled by the addition of a basic compound.

A number of basic substances capable of controlling the diffusion distance of the acid and therefore used for achieving high resolution are known (for example, JP2006-201532, JP2006-225476, JP2006-124314 and JP2006-106311) and almost all of nitrogenous basic substances except triphenylsulfonium hydroxide are usable.

Examples of such nitrogenous basic substances include primary, secondary and tertiary aliphatic amines, mixed amines, aromatic amines, heterocyclic amines, carboxyl-containing nitrogenous compounds, sulfonyl-containing nitrogenous compounds, hydroxyl-containing nitrogenous compounds, hydroxyphenyl-containing nitrogenous compounds, alcoholic nitrogenous compounds, amide derivatives and imide derivatives.

Specific examples of the primary aliphatic amines include butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines include di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of the tertiary aliphatic amines include, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the mixed amines include dimethylethylamine, methylethylpropylamine, benzylamine, phenethylamine, and benzyldimethylamine.

Specific examples of the aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isoxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-containing nitrogenous compounds include aminobenzoic acid, indolecarboxylic acid, and amino acid derivatives (e.g. nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the sulfonyl-containing nitrogenous compounds include 3-pyridinesulfonic acid and pyridinium p-toluenesulfonate.

Examples of the hydroxyl-containing nitrogenous compounds, hydroxyphenyl-containing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of the amide derivatives include formamide, N-methylformamide, N,N-dimethylformamide, acetamide, N-methylacetamide, N,N-dimethylacetamide, propionamide, and benzamide.

Examples of the imide derivatives include phthalimide, succinimide, and maleimide.

One or more basic compounds selected from the basic compounds represented by the following formula (B)-1 may also be added further.

$$N(Z)_n(Y)_{3-n} \quad \quad (B)\text{-}1$$

wherein n is an integer of 1, 2 or 3; the side chains Z may be the same or different and each represents a group represented by any one of the following formulas (Z)-1 to (Z)-3, and the side chains Y may be the same or different and each represents a hydrogen atom or a linear, branched or cyclic $C_{1-20}$ alkyl group which may contain an ether group or a hydroxyl group; or Zs may be coupled together to form a ring.

[Chemical formula 1]

wherein $R^{300}$, $R^{302}$ and $R^{305}$ each represents a linear or branched $C_{1-4}$ alkylene group; $R^{301}$ and $R^{304}$ each represents a hydrogen atom or a linear, branched or cyclic $C_{1-20}$ alkyl group which may contain one or more hydroxyl groups, ether groups, ester groups or lactone rings; $R^{303}$ represents a single bond or a linear or branched $C_{1-4}$ alkylene group; and $R^{306}$ represents a linear, branched or cyclic $C_{1-20}$ alkyl group which may contain one or more hydroxyl groups, ether groups, ester groups or lactone rings.

The following are specific examples of the compounds represented by the formula (B)-1.

Examples include tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1;10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyli)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone. These compounds may be used in combination.

Since these nitrogenous basic substances are, owing to their difference in structure, different from each other in not only pKb but also physical properties such as trapping capacity of hydrogen ions which serve as a catalyst for chemical amplification reaction or distribution in the binder, pattern shapes can be controlled delicately by selecting a proper one from them or using proper ones selected from them in combination and incorporating it (them) in the composition. After selection of the above-described essential materials such as binder and acid generator, therefore, the nitrogenous basic substance or combination of the nitrogenous basic substances most suited for them is selected to enable the optimum pattern formation.

As is described in the textbook of elementary organic chemistry, these nitrogenous basic substances become nitrogen oxides in the presence of an oxidizing agent. As will be described later in Test, even if the nitrogenous basic substance is stored at 0° C., a nitrogen oxide is produced when a solvent contains a peroxide therein. In addition, when one or more of the substituents of a nitrogen atom is hydrogen, meaning that the nitrogenous basic substance is a primary or secondary amine, the substance is not only oxidized into the corresponding oxide but also causes a decomposition reaction at a relatively low temperature. In some cases, the decomposition product becomes highly volatile and at last, is evaporated from the coated film or causes a serious sensitivity change because trapping capacity of hydrogen ions is drastically reduced or completely lost by the decomposition. Accordingly, when the nitrogenous basic substance employed has a hydrogen atom as at least one of the substituents of the nitrogen atom, the preparation process of a chemically amplified resist composition according to the present invention can be applied with particular advantage.

In the case of a nitrogenous basic substance in which all the atoms directly bonded to the nitrogen atom are not hydrogen atoms, it has a certain level of stability even if it becomes a nitrogen oxide so that it remains in the solution of the composition until application of the resulting resist composition. Decomposition is presumed to occur during a step of applying the composition to form a film which step is accompanied by heating. Even the decomposition product has some trapping capacity of hydrogen ions so that an unacceptable change does not occur by the oxidation of a slight amount of the nitrogenous basic substance. Most of the conventionally used nitrogenous basic substances are those in which all the atoms directly bonded to the nitrogen atom are other than hydrogen atoms so that importance of conversion into a nitrogen oxide has not attracted attentions. As is apparent from the influence of the selection of the nitrogenous basic substance on the pattern shape as described above, a change in the pattern shape is caused by oxidation of the nitrogenous basic substance into a nitrogen oxide. Empirically, when an oxidation ratio of the nitrogenous basic substance into a nitrogen oxide exceeds 20 mole %, the shapes of the patterns having a line width of 200 nm or less tend to fail to reach an acceptable level.

Materials used for preparation of the resist composition are subjected to precise purity analysis prior to use. Even if the material, such as solvent, has high purity, however, it is used in a great amount relative to the nitrogenous basic substance and only a small peroxide content possibly leads to the production of a critical amount of a nitrogen oxide.

Examples of the solvent typically used for resist compositions include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, γ-butyrolactone, propylene glycol methyl ether acetate, propylene glycol ethyl ether acetate, propylene glycol propyl ether acetate, methyl lactate, ethyl lactate, and propyl lactate. The above-described solvent may be used, for example, by preparing the respective constituent materials of the resist composition in advance and dissolving them successively in the solvent or dissolving each of them in the solvent and then mixing the resulting solutions. As an alternate method, a solution in the above-described solvent is prepared by substituting it for the solvent used for the synthesis reaction of the binder while distilling under reduced pressure. In some cases, the above-described solvent may be used as a reaction solvent upon synthesis. The above-described solvents may be used either singly or in combination.

The above-described generally-used solvents have an oxygen-containing functional group so that they have a possibility of forming a peroxide. In particular, the solvent having a secondary or tertiary carbon bonded to oxygen is at high risk of forming a peroxide due to the incorporation of oxygen in the air. Of the above-described solvents, methyl lactate, ethyl lactate and propyl lactate have a tertiary carbon bonded to oxygen and they are recognized to have a property of easily forming a peroxide only by leaving it in the air.

Moreover, when a solution containing a nitrogenous basic substance is prepared using a solvent containing a peroxide, a nitrogen oxide is inevitably formed, depending on its peroxide content. Even if it is stored at 0° C., formation of a nitrogen oxide cannot be prevented sufficiently. In order to avoid such a problem of nitrogen oxide formation, it is necessary to confirm that the solvent, particularly a solvent having, in the molecular structure thereof, a carbon-carbon double bond or having a structure in which oxygen is bonded to a secondary or tertiary carbon, more particularly a lactate ester does not contain a peroxide in an amount sufficient to cause the problem.

When the above-described solvent is stored as a raw material or as a solution containing the materials for constituting the resist composition, oxidation of the solvent with oxygen is preferably prevented by storing it in a hermetically sealed vessel while minimizing the clearance thereof or blocking it from oxygen with an inert gas such as nitrogen or argon.

A peroxide contained in the solvent can be analyzed quantitatively by chromatography such as GC or HPLC when the peroxide to be produced is identified in advance. It is also possible to quantitatively analyze the signal intensity of the peroxide by using NMR when a site to be oxidized is determined and its structure is known.

A peroxide content in a lipid or biologically-relevant material can be analyzed in an extremely common manner. Even if such a material contains an unknown peroxide or many kinds of peroxides, a peroxide content can be quantitatively analyzed by an analysis method employing, as an analyzing principle, redox reaction, for example, iodometric titration.

After all the constituent materials of the resist composition are dissolved, the resulting solution is filtered through a precision filter and poured into a hermetically sealed vessel. Control of an oxygen amount, preferably filling of an inert gas such as nitrogen or argon, renders the atmosphere in the vessel substantially free of oxygen so that the progress of oxidation of the solvent in the vessel is virtually terminated until the vessel is opened. In mixing of the constituent materials of the resist composition, by using a solvent whose peroxide content has already been elucidated by analysis and determining an acceptable level of peroxides contained in the resist solvent, the maximum oxidation amount of the nitrogenous basic compound in the resist composition during the storage term can be adjusted to not greater than a predetermined value. It is therefore possible to prevent an accident, that is, a change in resolution due to oxidation of the nitrogenous basic substance during the storage term by selecting the solvent having a peroxide content not greater than the acceptable level. The term "selecting" as used herein means not only omitting a solvent having an peroxide content greater than the acceptable level but also diluting a solvent having a peroxide content slightly exceeding the acceptable level with a solvent having a low peroxide content so as to adjust the peroxide content to not greater than the acceptable level. Particularly in a mixed solvent system, a solvent subject to form a peroxide may be used in combination with a solvent not subject to form a peroxide so that it is economically preferred to select them based on the peroxide content of the whole solvent. The peroxide content may be the sum of analysis values of respective solvents or the analysis value of a solvent mixture.

The acceptable level of a peroxide content in the solvent to be used for preparing the resist composition cannot be determined in a wholesale manner because it depends on the composition of the resist, desired storage stability, resolution or the like. For example, in the case of a resist composition for forming patterns having a line width of 200 nm or less, a drastic change in resolution even after storage for about 4 months can be prevented by selecting the solvent so as to suppress the peroxide content to be 2.5 mmol/L or less as a target. Quality deterioration which will otherwise occur by the oxidation of the nitrogenous basic compound can therefore be prevented. In the case as described above, a deterioration accident during storage of the resist composition can be prevented by controlling the peroxide content at 2.5 mmol/L or less as a requirement for selecting and managing the solvent to be used as the material.

The chemically amplified resist composition can be prepared usually by mixing 80 parts by mass of the binder with from 300 to 3000 parts by mass of the solvent, from 0.5 to 20 parts by mass of the acid generator, and from 0.001 to 10 parts by mass of the nitrogenous basic substance and then, if necessary adding an ordinarily employed modifier such as surfactant.

The present invention will next be described based on Examples. It should however be borne in mind that the present invention is not limited to or by them.

[Analysis of Peroxide by Iodometric Titration]

In a 200-ml flask with stopper, 10 ml of a sample was weighed precisely and 25 ml of an acetic acid:chloroform solution (3:2) was added thereto. After 1 ml of a saturated solution of potassium iodide was added, the resulting mixture was allowed to stand for 10 minutes in a dark place. To the reaction mixture were added 30 ml of distilled water and 1 ml of a starch solution and the reaction mixture was titrated with a 0.01N sodium thiosulfate solution until the mixture became colorless.

A blank test was performed by the above-described operation without adding the sample.

The amount of a peroxide was calculated based on the following formula:

Peroxide(mmol/L)=$(A-B) \times F$/amount of sample(ml)×100÷2

A: Consumption amount (ml) of 0.01N sodium thiosulfate for titration
B: Consumption amount (ml) of 0.01N sodium thiosulfate for titration in blank test
F: Titer of 0.01N sodium thiosulfate A detection limit of a peroxide by the present analysis method is 0.01 mmol/L.

[Test 1] Measurement of Air Oxidation Amount of Ethyl Lactate

Ethyl lactate for laboratory use which was stored in a 18-L plastic container ordinarily opened upon use in a laboratory was analyzed for its peroxide content with the passage of time. As a result, as shown below in Table 1, it has been confirmed that air oxidation has proceeded to a considerable degree with the passage of time.

TABLE 1

| | Number of days elapsed after starting of measurement | | | | |
|---|---|---|---|---|---|
| | 0 | 23 | 29 | 41 | 83 |
| Peroxide (mmol/L) | 2.95 | 4.45 | 5.23 | 7.52 | 15.85 |

[Test 2] Oxidation of Amine in Ethyl Lactate

Ethyl acetate solutions (1 L) of 2 g of tris(2-methoxymethoxyethyl)amine were prepared using ethyl lactates confirmed by the above-described test method to contain 5.0 mmol/L, 8.3 mmol/L and 15.0 mol/L of peroxides, respectively. Under a nitrogen atmosphere, the solutions were stirred for 160 hours at 23° C. and 0° C., followed by $^1$H-NMR measurement to determine the production amount of a nitrogen oxide (a molar ratio relative to unoxidized amine).

The $^1$H-NMR was measured using "JNM-EPP-300" (300 MHz) manufactured by JEOL and adding DMSO-$d_6$ to the sample solutions. From a ratio of the integral intensity (4.598 ppm) of the amine oxide to the integral intensity (4.574 ppm) of the amine of the signal thus observed, the production amount of the amine oxide was determined. As a result, it has been confirmed that 37.1%, 54.0% and 62.8% of the amine in the sample solutions were oxidized into the corresponding amine oxide at 23° C., while 20.3%, 38.4% and 45.2% of the amine were oxidized into the corresponding amine oxide at 0° C., respectively.

Example 1

Positive Resist

Chemically amplified resist compositions having the composition as described below were prepared using ethyl lactates containing (I) 2.1 mmol/L, (II) 5.3 mmol/L and (III) 10.4 mmol/L of peroxides, respectively, and propylene glycol monomethyl ether acetate containing 0.01 mmol/L or less of peroxides.

Composition of the Resist:

After mixing 80 parts by mass of a polymer represented by the following formula:

[Chemical formula 2]

$a:b:c = 81:10:9$ as a polymer, 6 parts by mass of an onium salt represented by the following formula:

[Chemical formula 3]

as an acid generator 1, 2 parts by mass of an onium salt represented by the following formula:

[Chemical formula 4]

as an acid generator 2, 0.315 part by mass of an amine represented by the following formula:

as a nitrogenous basic substance, 1100 parts by mass of each of the ethyl lactates, and 470 parts by mass of the propylene glycol monomethyl ether acetate, the resulting solution was filtered through a 0.03 µm filter to prepare a resist coating composition.

The resist compositions thus prepared were filled in a light resistant container without leaving a space therebetween as much as possible and stored at room temperature for a month. They were designated as Sample (I), Sample (II) and Sample (III), respectively.

Standard sample (I) were prepared as a resist compositions for comparison by mixing ethyl lactate containing 1.8 mmol/L of peroxides with propylene glycol monomethyl ether acetate containing 0.01 mmol/L or less of peroxides and Standard sample (II) were then prepared as a resist composition by mixing ethyl lactate containing 10.1 mmol/L of peroxides with propylene glycol monomethyl ether acetate containing 0.01 mmol/L or less of peroxides. These standard samples for reference were provided for the following treatment instantly after preparation. The three stored samples and two reference samples were each spin-coated onto a silicon wafer having a Cr-stacked surface and heated on a hot plate of 110° C. for 4 minutes to obtain a resist film of about 300 nm thick.

The resist film was exposed to an electron exposure apparatus ("HL-800D"; product of Hitachi Technology, acceleration voltage: 50 keV), baked at 110° C. for 4 minutes (PEB: post exposure bake), and developed with a 2.38% aqueous solution of tetramethylammonium hydroxide to obtain a positive resist pattern.

The pattern thus obtained was evaluated by dicing the wafer and observing a resist pattern shape using a scanning electron microscope ("S4700H", product of Hitachi, Ltd.). The results are shown below in Table 2.

TABLE 2

| Sample | Sensitivity ($\mu C/cm^2$) | Limit resolution (nm) | Pattern shape |
| --- | --- | --- | --- |
| Sample (I) | 9 | 100 | Rectangular |
| Sample (II) | 8.8 | 110 | Slightly round top |
| Sample (III) | 8.5 | 120 | Round top, tapered |
| Standard sample (I) | 9 | 100 | Rectangular |
| Standard sample (II) | 9 | 100 | Rectangular |

Example 2

Negative Resist

Chemically amplified resist compositions having the composition as described below were prepared using ethyl lactates containing (IV) 2.1 mmol/L, (V) 5.3 mmol/L, and (VI) 10.4 mmol/L of peroxides, respectively and propylene glycol monomethyl ether acetate containing 0.001 mmol/L or less of peroxides.

Composition of the Resist

After mixing 80 parts by mass of a polymer represented by the following formula:

[Chemical formula 5]

$a:b:c = 81:10:9$ as a polymer, 8 parts by mass of a crosslinking agent represented by the following formula:

[Chemical formula 6]

as a crosslinking agent, 10 parts by mass of an onium salt represented by the following formula:

[Chemical formula 7]

as an acid generator, 0.52 part by mass of an amine represented by the following formula:

as a nitrogenous basic substance, 760 parts by mass of each of the ethyl lactates, and 320 parts by mass of the propylene glycol monomethyl ether acetate, the resulting solution was filtered through a 0.03 µm filter to prepare resist coating compositions.

The resist compositions thus prepared were filled in a light shielding container without leaving a space in the container and stored at room temperature for a month. They were designated as Sample (IV), Sample (V) and Sample (VI), respectively.

Standard sample (III) were then prepared as a resist composition for comparison by mixing ethyl lactate containing 1.8 mmol/L of peroxides with propylene glycol monomethyl ether acetate containing 0.01 mmol/L or less of peroxides and Standard sample (IV) were then prepared by mixing ethyl lactate containing 10.1 mmol/L of peroxides with propylene glycol monomethyl ether acetate containing 0.01 mmol/L or less of peroxides. These standard samples for reference were provided for the following treatment instantly after preparation.

The three stored samples and two reference samples were each spin-coated onto a silicon wafer having a Cr-stacked surface and heated on a hot plate of 110° C. for 4 minutes to obtain a resist film of about 300 nm thick.

The resist film was exposed to an electron exposure apparatus ("HL-800D"; product of Hitachi Technology, acceleration voltage: 50 keV), baked at 120° C. for 4 minutes (PEB: post exposure bake), and developed with a 2.38% aqueous solution of tetramethylammonium hydroxide to obtain a negative resist pattern.

The pattern thus obtained was evaluated by dicing the wafer and observing a resist pattern shape using a scanning electron microscope [SEM] ("S4700H", product of Hitachi, Ltd.). The results are shown below in Table 3.

TABLE 3

| Sample | Sensitivity ($\mu C/cm^2$) | Limit resolution (nm) | Pattern shape |
| --- | --- | --- | --- |
| Sample (IV) | 10 | 100 | Rectangular |
| Sample (V) | 10.3 | 110 | Slightly round top |
| ~~Sample (VI)~~ | ~~10.5~~ | ~~120~~ | ~~Round top~~ |
| Standard sample (III) | 10 | 100 | Rectangular |
| Standard sample (IV) | 10 | 100 | Rectangular |

Tables 2 and 3 showed that when the solvent used has a high peroxide content, the storage stability of the resulting resist composition is deteriorated in spite of no large difference in storage stability instantly after preparation, and both the positive resist and negative resist have impaired rectangularity and therefore have defects in the shape.

Measurement of a peroxide content in a solvent prior to the preparation of a resist therefore makes it possible to avoid such a risk of preparing defective products, thereby maintaining product reliability.

It is to be understood that the present invention is not limited to the embodiments given above. The embodiments given above are merely illustrative, and those having substantially the same configuration as the technical concept defined by the appended claims of the present invention and having similar functions and effects are considered to fall within the technical scope of the present invention.

The invention claimed is:

1. A method for preparing a chemically amplified resist composition comprising a binder, an acid generator, a nitrogenous basic substance and a solvent, comprising the steps of:
    selecting, as the solvent, a solvent having a peroxide content not greater than a level of 2.5 mmol/L; and
    mixing in the selected solvent the other components of the resist composition.

2. The method according to claim 1, wherein the solvent has, in the molecule thereof, a carbon-carbon double bond, ether bond, carbonyloxy group, and/or hydroxyl group.

3. The method according to claim 1, wherein the level of peroxide content in the solvent is 2.1 mmol/L.

4. The method according to claim 1, wherein the method further comprises storing the resist composition in a hermetically sealed vessel.

5. A method for preparing a chemically amplified resist composition comprising a binder, an acid generator, a nitrogenous basic substance and a solvent, comprising the steps of:
    determining how much peroxide may be contained in the solvent without causing the oxidation ratio of the nitrogenous basic substance into a nitrogen oxide to exceed a predetermined value;
    selecting, as the solvent, a solvent having a peroxide content level of 2.5 mmol/L or less; and
    mixing in the selected solvent the other components of the resist composition.

6. The method according to claim 5, wherein the predetermined value is 20 mole %.

7. The method according to claim 5, wherein the amount of peroxide that may be contained in the solvent without causing the oxidation ratio of the nitrogenous basic substance into a nitrogen oxide to exceed the predetermined value is 2.1 mmol/L.

* * * * *

UNITED STATES PATENT AND TRADEMARK OFFICE
CERTIFICATE OF CORRECTION

PATENT NO. : 8,367,295 B2
APPLICATION NO. : 12/110651
DATED : February 5, 2013
INVENTOR(S) : Masunaga et al.

Page 1 of 1

It is certified that error appears in the above-identified patent and that said Letters Patent is hereby corrected as shown below:

In the Specifications:
Column 13, Lines 42-50: Please replace TABLE 2 with the following table:

TABLE 2

| Sample | Sensitivity ($\mu C/cm^2$) | Limit resolution (nm) | Pattern shape |
|---|---|---|---|
| Sample (I) | 9 | 100 | Rectangular |
| Sample (II) | 8.8 | 110 | Slightly round top |
| Sample (III) | 8.5 | 120 | Round top, tapered |
| Standard sample (I) | 9 | 100 | Rectangular |
| Standard sample (II) | 9 | 100 | Rectangular |

Column 15, Lines 16-24: Please replace TABLE 3 with the following table:

TABLE 3

| Sample | Sensitivity ($\mu C/cm^2$) | Limit resolution (nm) | Pattern shape |
|---|---|---|---|
| Sample (IV) | 10 | 100 | Rectangular |
| Sample (V) | 10.3 | 110 | Slightly round top |
| Sample (VI) | 10.5 | 120 | Round top |
| Standard sample (III) | 10 | 100 | Rectangular |
| Standard sample (IV) | 10 | 100 | Rectangular |

Signed and Sealed this
Eighteenth Day of June, 2013

Teresa Stanek Rea
*Acting Director of the United States Patent and Trademark Office*